(12) United States Patent
Greim

(10) Patent No.: US 6,795,037 B2
(45) Date of Patent: Sep. 21, 2004

(54) RADIO-FREQUENCY ANTENNA FOR A MAGNETIC RESONANCE SYSTEM

(75) Inventor: Helmut Greim, Adelsdorf (DE)

(73) Assignee: Siemens Aktiengesellschaft, Munich (DE)

( * ) Notice: Subject to any disclaimer, the term of this patent is extended or adjusted under 35 U.S.C. 154(b) by 20 days.

(21) Appl. No.: 10/388,818

(22) Filed: Mar. 14, 2003

(65) Prior Publication Data

US 2003/0222832 A1 Dec. 4, 2003

(30) Foreign Application Priority Data

Mar. 15, 2002 (DE) .......................................... 102 11 567

(51) Int. Cl.[7] .............................. H01Q 9/30; G01V 3/00
(52) U.S. Cl. ........................ 343/900; 343/895; 343/750; 324/300; 324/318; 324/322
(58) Field of Search ................................. 343/900, 895, 343/750, 700 MS; 324/300, 318, 322, 307; H01Q 9/30; G01V 3/00

(56) References Cited

U.S. PATENT DOCUMENTS 6,114,854 A * 9/2000 Greim ........................ 324/318
6,133,737 A * 10/2000 Greim ........................ 324/318
6,552,546 B2 * 4/2003 Greim ........................ 324/318
2003/0184298 A1 * 10/2003 Heid et al. .................. 324/318

FOREIGN PATENT DOCUMENTS

EP          1 085 337        3/2001      ........... G01R/33/34

OTHER PUBLICATIONS

Patent Abstracts of Japan Publication No. 01075951 A for Japanese Application 62232410.

* cited by examiner

Primary Examiner—Don Wong
Assistant Examiner—Trinh Vo Dinh
(74) Attorney, Agent, or Firm—Schiff Hardin LLP

(57) ABSTRACT

A radio-frequency antenna for a magnetic resonance system has a basic element with two end rings and a number of antenna rods, and a radio-frequency mirror. The end rings are arranged concentrically relative to an antenna axis can and are axially offset from one another. The antenna rods are arranged around the antenna axis and connect the end rings. The radio-frequency mirror is inductively coupled to the end rings and the antenna rods. It limits a magnetic resonance excitation signal emitted by the antenna and/or a magnetic resonance signal received by the antenna axially at one side.

17 Claims, 4 Drawing Sheets

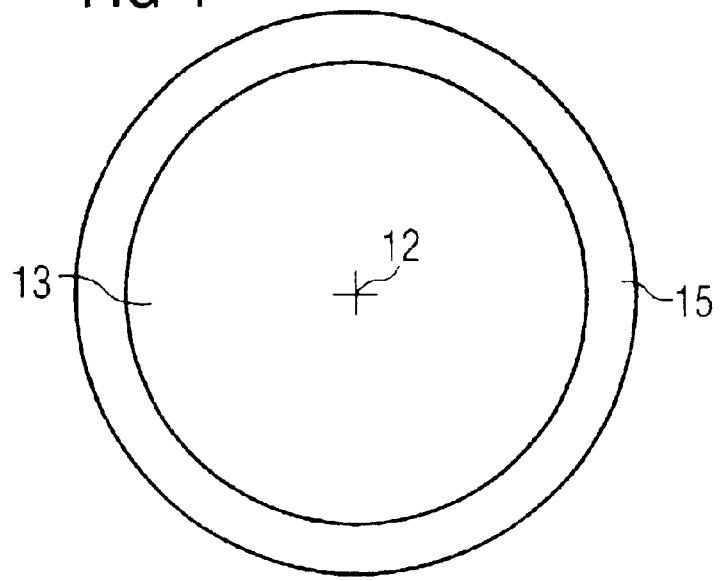
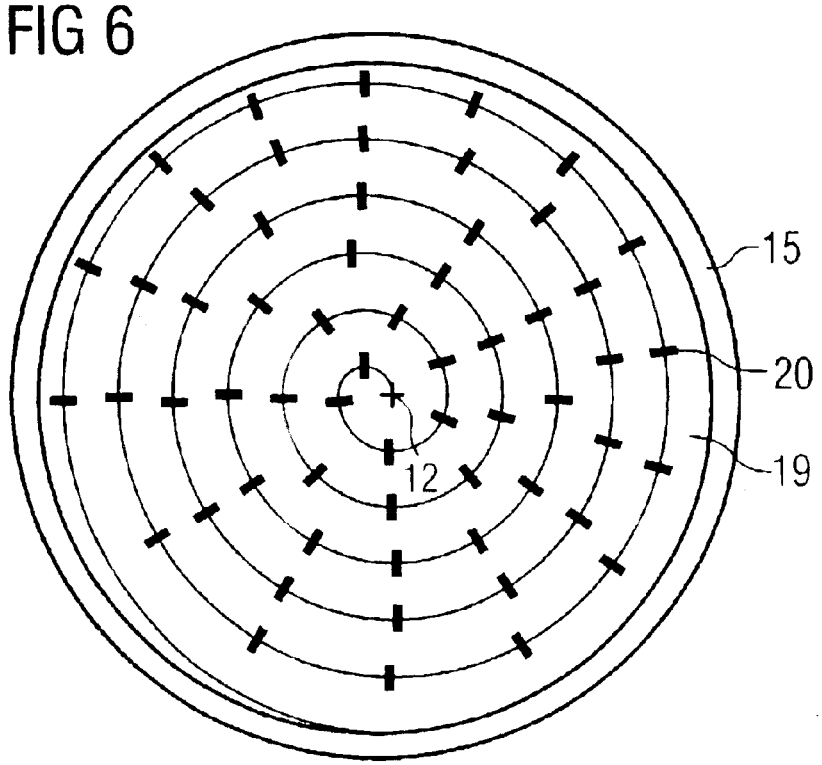

RADIO-FREQUENCY ANTENNA FOR A MAGNETIC RESONANCE SYSTEM

BACKGROUND OF THE INVENTION

1. Field of the Invention

The present invention is directed to a radio-frequency antenna for a magnetic resonance system, of the type having a basic element formed by two end rings and a number of antenna rods, the end rings being arranged concentric to an antenna axis and being axially offset relative to one another, and wherein the antenna rods are arranged around the antenna axis and connect the end rings to one another.

2. Description of the Prior Art

Radio-frequency antennas of this type are generally known as birdcage resonators. In such a birdcage resonator, capacitors are arranged in the end rings and/or in the antenna rods. The radio-frequency antenna is tuned such that it forms a resonant circuit at a predefined or pre-definable operating frequency of the radio-frequency antenna.

Such radio-frequency antennas are also known from the English Abstract of Japanese Application 01 075 951 and European Application 1 085 337. In the Japanese patent, the antenna rods are short-circuited at an end ring by further antenna rods that proceed in the plane of the end ring in order to homogenize the sensitivity profile of the antenna. In the European application, the radio-frequency antenna has a displaceable conductor loop provided with a tuning capacitor, this conductor loop surrounding the antenna rods and being inductively coupled to the end rings in order to thus tune the frequency of the antenna.

Magnetic fields emitted by the radio-frequency antenna excite nuclear spins of an examination subject (often a human) into resonance. The resonant signals are then acquired and evaluated. The acquisition of the resonant signals can ensue with the same antenna.

The radio-frequency antenna can be alternatively fashioned as a whole-body coil or as a local coil for the examination of the head or extremities of a human. Local coils are employed in order to achieve a significantly better signal-to-noise ratio than with an overall or whole-body antenna.

In order to optimize the signal-to-noise ratio, radio-frequency antennas are optimized in terms of geometry and transmission and/or reception profile for the different body regions. An optimally good matching to the anatomy of the patient should ensue. Further, an optimally high filling factor of the coil is desirable.

Compromises are always necessary with respect to the optimization of the transmission or reception profile in the case of conventional local coils. A radio-frequency antenna that tapers toward the end (what is referred to as barrel shape) would be desirable for an optimum imaging, however, such a radio-frequency antenna exhibits the disadvantage that it is invariable and closed at one side.

SUMMARY OF THE INVENTION

An object of the present invention is to provide a radio-frequency antenna wherein a high filling factor can be achieved in a simple way.

This object is achieved in accordance with the invention in a radio-frequency antenna having a radio-frequency mirror that is galvanically separated from the end rings and the antenna rods but is inductively coupled to them, so that a magnetic resonance excitation signal emitted by the radio-frequency antenna and/or a magnetic resonance signal received by the radio-frequency antenna is axially limited at one side.

As a result, a variation of the positioning of the radio-frequency mirror is possible.

Examination steps alternate with treatment steps in various applications, for example stereotaxy. In this case, a closed coil shape is not possible since no access to the patient would be possible when the coil is applied.

In an embodiment wherein the radio-frequency mirror is mechanically releasably connectable to the basic element, a nearly optimum imaging or free access to the patient can be achieved as selectable alternatives with the radio-frequency antenna.

Given a radio-frequency mirror connected to the basic element, the radio-frequency antenna has a transmission profile and reception profile that nearly achieve the profile of the optimum barrel shape. With the radio-frequency mirror removed, in contrast, access to the patient is preserved.

A even greater optimization due to a higher degree of coil utilization is possible when the radio-frequency mirror is connectable to the basic element in a number of axial positions.

An infinitely variable adjustment is even possible in an embodiment wherein the radio-frequency mirror is connectable to the basic element in an axially displaceable manner.

In an embodiment wherein the antenna rods proceed parallel to the antenna axis, the spacing of the radio-frequency mirror from the antenna rods is independent of its axial positioning.

The number of antenna rods in the inventive radio-frequency antenna typically amounts to between four and sixteen, and is usually even.

In the simplest case, the radio-frequency mirror can be fashioned as a metallic plate or sheet proceeding transversely relative to the antenna axis. Fewer low-frequency eddy currents arise, however, when the radio-frequency mirror is fashioned as a system of interconnects that are galvanically separated from one another and proceed concentric to the antenna axis, the system being disposed transversely relative to the antenna axis.

In this latter instance, the interconnects can be galvanically interrupted (have gaps), the interruptions being bridged by capacitors and/or the interconnects can be bridged relative to one another with capacitors. Either measure reduces the low-frequency eddy currents even though the interconnects are short-circuited in terms of radio frequency.

In the optimum case, the radio-frequency mirror is fashioned as an interconnect that proceed helically around the antenna axis. In this design as well, the interconnect can be radially bridged with capacitors.

For mechanical stability, the radio-frequency mirror preferably is arranged on an electrically non-conductive carrier. The carrier can be fashioned, for example, as a circuit board.

The inventive radio-frequency antenna preferably is fashioned as a head coil. In this case, it has an essentially cylindrical examination volume with a diameter of 18 to 30 cm and a length of 18 to 30 cm. The inventive antenna also can be fashioned as a whole-body coil with a diameter of 50 to 80 cm and a length of 30 to 150 cm.

DESCRIPTION OF THE DRAWINGS

FIGS. 4-6 respectively show various radio-frequency mirrors suitable for use in the inventive radio-frequency antenna.

DESCRIPTION OF THE PREFERRED EMBODIMENTS

Figure 1:
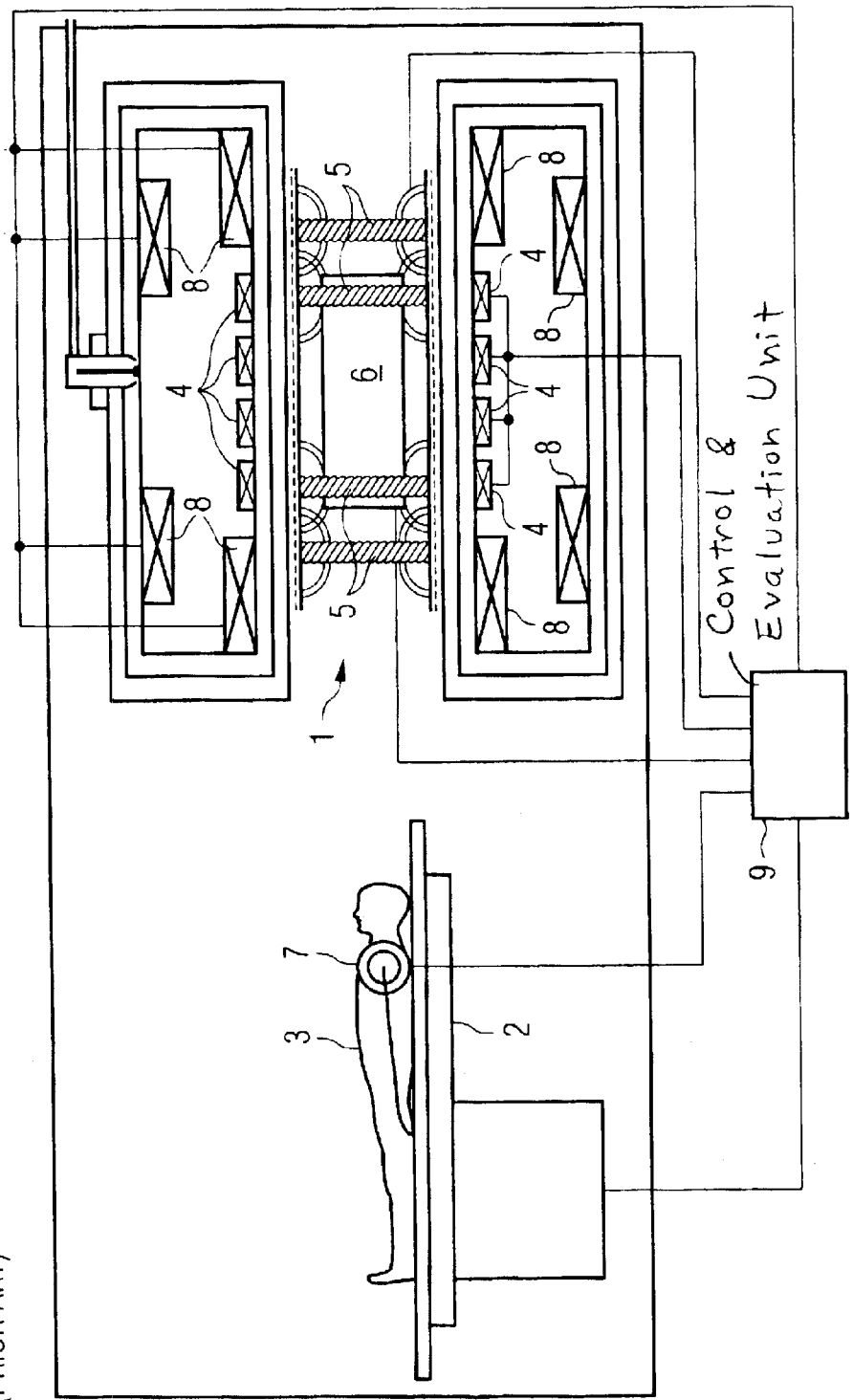
FIG. 1 illustrates the basic components of a magnetic resonance system.

As shown in FIG. 1, the magnetic resonance system has an examination space 1. A patient (in general: an examination subject 3) can be introduced into the examination space by means of a patient bed 2.

The examination space 1 is surrounded by various magnets and magnet systems. First, there is a basic magnet 4. The basic magnet 4 serves for generating a homogeneous basic magnetic field. A gradient magnet system 5 is also present. Gradient fields that are required for generating meaningfully interpretable magnetic resonance signals are generated with the gradient magnet system 5. The magnet system also includes a whole-body coil 6. The whole-body coil 6 is fashioned as a radio-frequency antenna. Given operation as transmission antenna, it serves for exciting magnetic resonance signals in the examination subject 3. Given operation as reception antenna, it serves for the reception of previously excited magnetic resonance signals of the examination subject 3.

At least one local coil 7 usually also can be introduced into the interior of the examination space 1. It is likewise fashioned as radio-frequency antenna. It usually serves for the local reception of magnetic resonance signals that were previously excited with the whole-body coil 6. On a case-by-case basis, however, the local coil also can be operated as a transmission antenna, just like the whole-body coil 6.

The basic magnet 4, the gradient magnet system 5 and the coils 5, 6, 7, are surrounded by a shield magnet 8.

The basic magnet 4, the gradient magnet system 5 and the coils 6, 7 are connected to a control and evaluation unit 9. In a known way, this effect drives the gradient magnet system 5 and of the coils 6, 7 to excite, receive and evaluate magnetic resonance signals.

Figure 2:
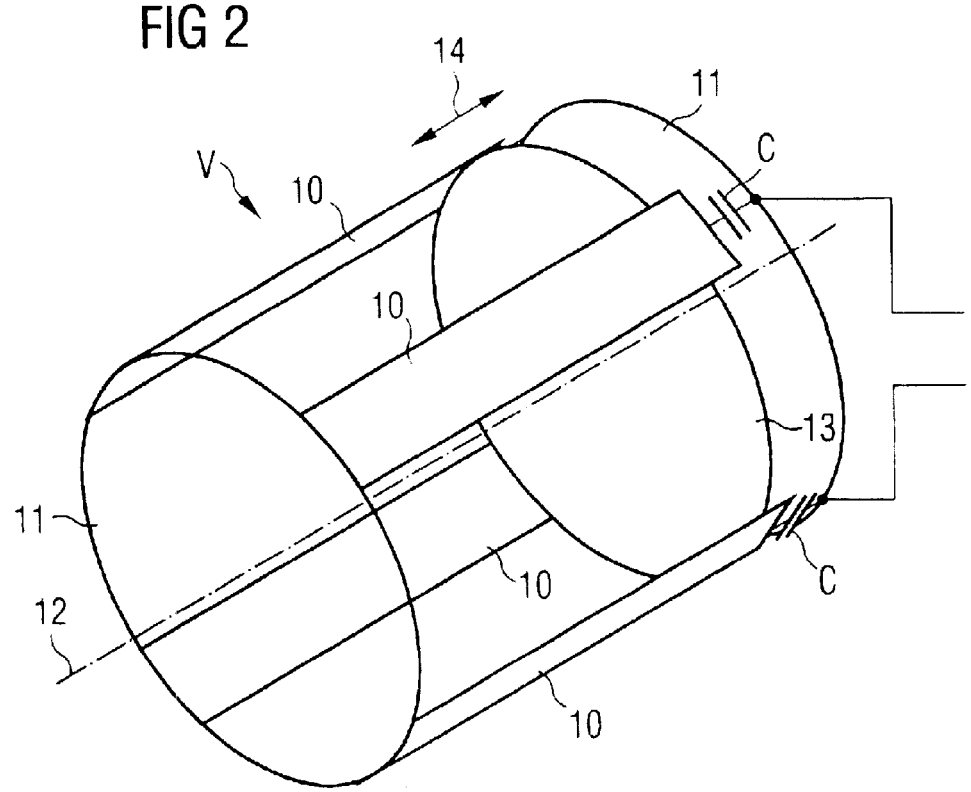
FIG. 2 us a perspective view of a radio-frequency antenna with a radio-frequency mirror, in accordance with the invention.

As shown in FIG. 2, the local radio-frequency antenna 7 has a number of antenna rods 10 as well as two end rings 11. In the embodiment of FIG. 2, the antenna rods 10 are thereby fashioned as flat conductors having a width between 2 and 7 cm and a thickness between 15 and 100 μm. They are usually fashioned as interconnects arranged on printed circuit boards.

Capacitors C with which the radio-frequency antenna 7 is tuned to a specific operating frequency also are arranged in the antenna rods 10 and/or end rings 11. According to FIG. 2, these capacitors are arranged in the antenna rods 10. This, however, is of secondary importance in the context of the present invention.

The end rings 11 are arranged concentrically relative to an antenna axis 12. As can be seen, they are axially offset from one another relative to the antenna axis 12.

The antenna rods 10 proceed parallel to the antenna axis 12. They are arranged uniformly distributed around the antenna axis 12. They connect the end rings 11 to one another.

As shown in FIG. 2, the radio-frequency antenna 7 also has a radio-frequency mirror 13. As indicated with a double arrow 14 in FIG. 2, the radio-frequency mirror 13 can be continuously axially displaced (i.e., with infinite variation) parallel to the antenna axis 12 relative to a basic element that is composed of the end rings 11 and the antennas rods 10. The radio-frequency mirror 13 can be mechanically connected to the basic element in each of these axial positions.

A radio-frequency field that normally leaks out of the radio-frequency antenna 7 can be forced back into the radio-frequency antenna 7 in correct phase by means of the radio-frequency mirror 13. The homogeneity of the transmission and reception profiles of the local coil 7 are significantly improved as a result. A magnetic resonance excitation signal sent by the radio-frequency antenna 7, or a magnetic resonance signal received by the radio-frequency antenna 7, is thus axially limited at one side by means of the radio-frequency mirror 13.

The radio-frequency mirror 13, however, is not only axially displaceable relative to the basic element but also can be mechanically released therefrom. Thus, it can be removed, so that the accessibility to the inside of the coil is preserved—when the radio-frequency mirror 13 is removed.

In the embodiment of FIG. 2, the radio-frequency antenna 7 has four antenna rods 10. The number of antennas rods 10 is thus even. The radio-frequency antenna 7, however, alternatively can have more than four antenna rods 10. In a local coil 7, however, the number of antenna rods usually does not amount to more than sixteen, and preferably amounts to four, eight or twelve.

Figure 3:
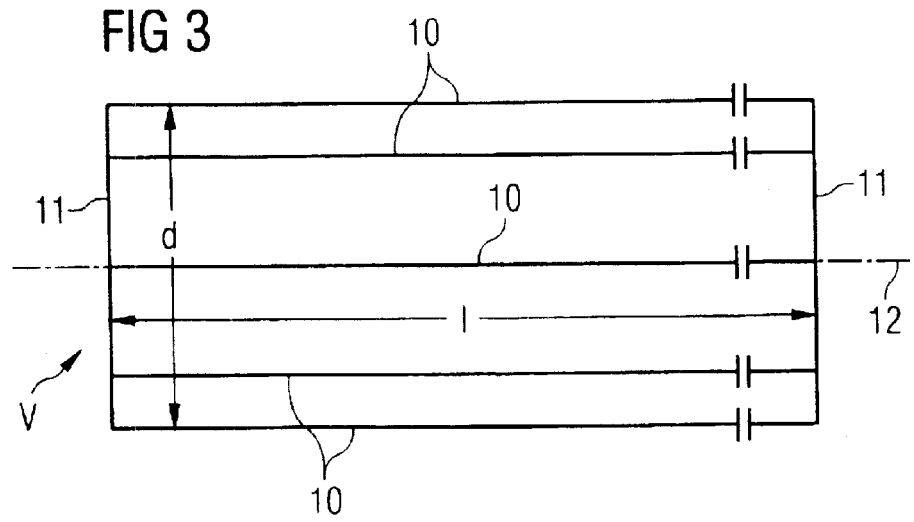
FIG. 3 shows the radio-frequency antenna of FIG. 2, without the radio-frequency mirror, in a side view.

As shown in FIGS. 2 and 3, the radio-frequency antenna 7 (having eight antenna rods 10 therein) has an essentially cylindrical examination volume V having a length l and a diameter d, dependent on the intended purpose of the local coil 7.

When the local coil 7 is fashioned as head coil, the length l and the diameter d lie on the same order of magnitude. Typical values are l=18 . . . 30 cam and d=18 . . . 30 cm. Usually the length l and the diameter d are the same.

In the whole-body coil, in contrast, the diameter is noticeably larger. For example, it typically comprises a diameter d of 50 . . . 80 cm and a length l of 30 . . . 150 cm.

As shown in FIG. 4, the radio-frequency mirror 13 is fashioned as a metallic plate or sheet disposed transversely relative to the antenna axis 12. The plate or sheet is arranged on a circuit board that serves as an electrically non-conductive carrier 15 for the radio-frequency mirror 13. The carrier 15 projects beyond the radio-frequency mirror 13. As a result thereof, the radio-frequency mirror 13 is only inductively coupled to the end rings 11 and to the antenna rods 10, and is galvanically separated from them. In the embodiment of FIG. 4, the radio-frequency mirror 13 is constructed in a simple way but still exhibits relatively high low-frequency eddy currents.

Figure 5:
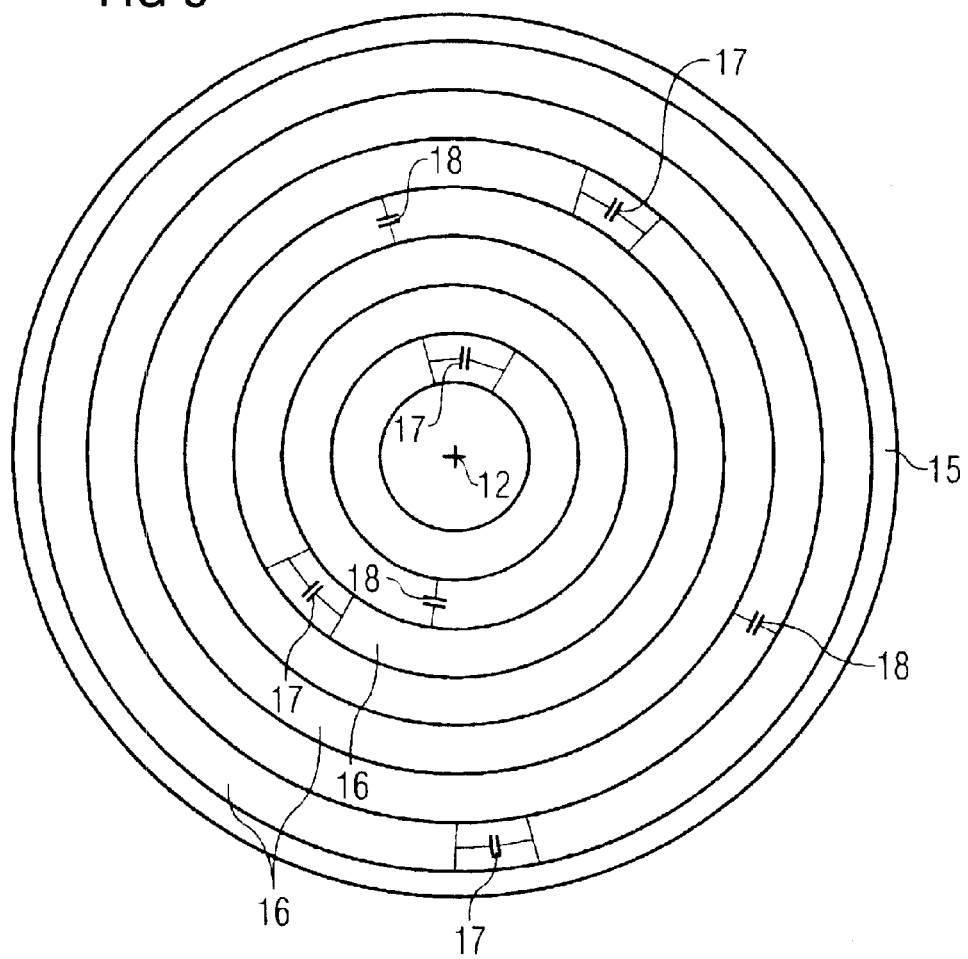

The radio-frequency mirror 13 shown in FIG. 5 also is arranged on a circuit board as an electrically non-conductive carrier 15. The high-frequency mirror 13 is composed of a system of interconnects 16. The system of interconnects 16 is disposed transversely relative to the antenna axis 12. The interconnects 16 proceed concentrically to the antenna axis 12, and are galvanically separated from one another. As can be seen, the interconnects are galvanically interrupted and bridged by capacitors 18 at the points of interruption. The interconnects 16 also are bridged to one another with capacitors 18. The embodiment according to FIG. 5 effects a rather good suppression of low-frequency eddy currents.

Optimum suppression is achieved with the embodiment according to FIG. 6. In this embodiment as well, the radio-frequency mirror 13 is arranged on a circuit board as a carrier 15. In the embodiments of FIG. 6, the radio-frequency mirror 13 is fashioned as a single interconnect 19 that proceeds helically around the antenna axis 12. The individual turns of the interconnect 19 are radially bridged with capacitors 20.

The radio-frequency mirror 13 and the carrier 15 form an auxiliary element. For displacing and/or releasing the radio-frequency mirror 13, it thus suffices to displace the auxiliary element relative to the basic element as a unit or, respectively, release it therefrom. Disassembly of the auxiliary element is not required. The displacement as well as the release of the auxiliary element can ensue without tools. The radio-frequency mirror 13 or the auxiliary element thus can be displaced relative to or released from the basic element without disassembly of the basic element.

Due to the releasability of the radio-frequency mirror 13, the inventive radio-frequency antenna 7 can be operated optionally with or without the radio-frequency mirror 13. The radio-frequency antenna 7 can therefore be utilized in applications wherein high image quality is a concern and also can be utilized in applications wherein free accessibility to the examination volume V is required.

Although modifications and changes may be suggested by those skilled in the art, it is the intention of the inventor to embody within the patent warranted hereon all changes and modifications as reasonably and properly come within the scope of his contribution to the art.

I claim as my invention:

1. A radio-frequency antenna for a magnetic resonance apparatus comprising:

a basic element and a radio-frequency mirror;

said basic element comprising two end rings and a plurality of antenna rods, said end rings being disposed concentrically around an antenna axis and being axially offset relative to each other and connecting said end rings to each other; and said radio-frequency mirror being galvanically separated from said end rings and said antenna rods, and being inductively coupled to said end rings and said antenna rods to axially limit an antenna signal at one side of said basic element, said antenna signal being selected from the group consisting of an excitation signal emitted by said basic element and a magnetic resonance signal received by said basic element.

2. A radio-frequency antenna as claimed in claim 1 wherein said radio-frequency mirror is mechanically releasably connectable to said basic element.

3. A radio-frequency antenna as claimed in claim 1 wherein said radio-frequency mirror is connectable to said basic element in a plurality of axial positions.

4. A radio-frequency antenna as claimed in claim 3 wherein said radio-frequency mirror is axially displaceably connectable to said basic element.

5. A radio-frequency antenna as claimed in claim 1 wherein said antenna rods are disposed parallel to said antenna axis.

6. A radio-frequency antenna as claimed in claim 1 wherein said plurality of antenna rods is between 4 and 16.

7. A radio-frequency antenna as claimed in claim 1 wherein said plurality of antenna rods is even.

8. A radio-frequency antenna as claimed in claim 1 wherein said radio-frequency mirror comprises a planar metallic element, selected from the group consisting of a metallic plate and a metallic sheet, disposed transversely to said antenna axis.

9. A radio-frequency antenna as claimed in claim 1 wherein said radio-frequency mirror comprises a system of interconnects that are galvanically separated from each other and disposed concentrically relative to said antenna axis, said system being disposed transversely to said antenna axis.

10. A radio-frequency antenna as claimed in claim 9 wherein said interconnects are galvanically interrupted at respective interruptions, said respective interruptions being bridged by capacitors.

11. A radio-frequency antenna as claimed in claim 9 wherein said interconnects are bridged to each other via capacitors.

12. A radio-frequency antenna as claimed in claim 1 wherein said radio-frequency mirror comprises an interconnect proceeding helically around said antenna axis.

13. A radio-frequency antenna as claimed in claim 12 wherein said interconnect is radially bridged with capacitors.

14. A radio-frequency antenna as claimed in claim 1 wherein said radio-frequency mirror comprises an electrically conductive element disposed on an electrically non-conductive carrier.

15. A radio-frequency antenna as claimed in claim 14 wherein said carrier is a circuit board.

16. A radio-frequency antenna as claimed in claim 1 wherein said basic element defines a substantially cylindrical examination volume within said basic element, said examination volume having a diameter in a range between 50 and 80 cm and a length in a range between 30 and 150 cm.

17. A radio-frequency antenna as claimed in claim 1 wherein said basic element defines a substantially cylindrical examination volume within said basic element, said examination volume having a diameter in a range between 18 and 30 cm and a length in a range between 18 and 30 cm.

* * * * *